(12) United States Patent
Wang et al.

(10) Patent No.: US 8,308,893 B2
(45) Date of Patent: Nov. 13, 2012

(54) NANO-OXIDE PROCESS FOR BONDING COPPER/COPPER ALLOY AND RESIN

(76) Inventors: Ming De Wang, Naugatuck, CT (US);
Steven A. Castaldi, Torrington, CT (US); Kesheng Feng, Cheshire, CT (US)

( * ) Notice: Subject to any disclaimer, the term of this patent is extended or adjusted under 35 U.S.C. 154(b) by 371 days.

(21) Appl. No.: 12/697,425

(22) Filed: Feb. 1, 2010

(65) Prior Publication Data

US 2011/0186221 A1   Aug. 4, 2011

(51) Int. Cl.
| | |
|---|---|
| H01L 21/316 | (2006.01) |
| C04B 28/36 | (2006.01) |
| C04B 37/00 | (2006.01) |
| C08J 5/12 | (2006.01) |
| C08J 3/09 | (2006.01) |
| B41J 2/16 | (2006.01) |
| B32B 7/12 | (2006.01) |

(52) U.S. Cl. ............... 156/327; 106/287.18; 106/287.23; 106/287.3; 156/325; 156/326; 524/259

(58) Field of Classification Search ............. 106/208.18, 106/287.23, 287.3; 156/325, 326, 327; 524/259
See application file for complete search history.

(56) References Cited

U.S. PATENT DOCUMENTS

| | | | |
|---|---|---|---|
| 2,364,993 A | 12/1944 | Meyer | |
| 4,130,455 A * | 12/1978 | Elias et al. | ................... 216/106 |
| 4,409,037 A | 10/1983 | Landau | |
| 4,642,161 A | 2/1987 | Akahoshi et al. | |
| 4,844,981 A | 7/1989 | Landau | |
| 4,902,551 A | 2/1990 | Nakaso et al. | |
| 4,969,958 A | 11/1990 | Mombrun et al. | |
| 4,981,560 A | 1/1991 | Kajihara et al. | |
| 4,997,516 A | 3/1991 | Adler | |
| 4,997,722 A | 3/1991 | Adler | |
| 5,289,630 A | 3/1994 | Ferrier et al. | |
| 5,869,130 A | 2/1999 | Ferrier | |
| 6,020,029 A | 2/2000 | Ferrier et al. | |
| 6,054,061 A | 4/2000 | Bayes et al. | |
| 6,146,701 A | 11/2000 | Ferrier | |
| 6,162,503 A | 12/2000 | Ferrier | |
| 6,383,272 B1 | 5/2002 | Ferrier | |
| 6,419,784 B1 | 7/2002 | Ferrier | |

(Continued)

OTHER PUBLICATIONS

Dietz, K. Tech Talk—Fine Lines in High Yield (Part CXLVIII) Adhesion to Copper—Trends and Issues, CircuiTree Magazine, Jan. 2008.
Osborne, A..., An Alternate Route to Red Oxide for Inner Layers, PC Fab, Aug. 1984.

*Primary Examiner* — Michael Orlando
(74) *Attorney, Agent, or Firm* — Carmody & Torrance LLP

(57) ABSTRACT

A method of increasing adhesion between a copper or copper alloy layer and a polymeric resin. The method includes the steps of a) applying a pre-dip composition to the copper layer; b) applying a nano-oxide composition to the treated copper layer, c) applying a post-dip composition to the nano-oxide treated surface, and d) bonding a resin to the treated copper surface. The nano-oxide composition comprises (i) a chlorite; (ii) a caustic; (iii) a phosphate salt; (iv) an organic nitro compound; and (v) a thio compound. The post-dip composition is an alkaline solution that comprises (i) a phosphate salt; (ii) a source of molybdenum ions; and (iii) a thiazole. The process of the invention is useful for improving the bond between copper and a resin, including high Tg resins, halogen-free resins, and high speed/lost resins.

28 Claims, 3 Drawing Sheets

U.S. PATENT DOCUMENTS

| | | |
|---|---|---|
| 6,506,566 B2 | 1/2003 | Markvardsen et al. |
| 6,554,948 B1 | 4/2003 | Ferrier |
| 6,830,627 B1 | 12/2004 | Covert et al. |
| 2001/0052510 A1 | 12/2001 | Schemenaur et al. |
| 2002/0106458 A1 | 8/2002 | Montano et al. |
| 2006/0065365 A1* | 3/2006 | Ferrier .................. 156/316 |
| 2008/0096046 A1 | 4/2008 | Yamashita et al. |
| 2009/0294294 A1 | 12/2009 | Feng et al. |

* cited by examiner

NANO-OXIDE PROCESS FOR BONDING COPPER/COPPER ALLOY AND RESIN

FIELD OF THE INVENTION

The present invention relates to printed circuits, and more particularly to a process for improving the bond between copper/copper alloy and resin, such as in multilayer printed circuit boards.

BACKGROUND OF THE INVENTION

Multilayer printed circuit boards are used for a variety of electrical applications and provide the advantages of weight and space conservation in electronic devices. A multilayer board is comprised of two or more circuit layers, each circuit layer separated from another by one or more layers of dielectric material. Circuit layers are formed by applying a copper layer onto a polymeric substrate. Printed circuits are then formed by techniques well known in the art. For example, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

Once the circuit patterns are formed, a stack is formed comprising multiple circuit layers separated from each other by a dielectric layer. The one or more circuitry innerlayers of any particular type or types of circuitry pattern, as well as circuitry innerlayers which might constitute ground planes and power planes, are assembled into the multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The thus cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive efforts in developing a multilayer printed circuit fabrication process which is not susceptible to such localized delamination. It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination during subsequent processing and/or use. In response to this problem, techniques of forming on the copper surfaces of the circuitry innerlayers (before assembling them with pre-preg layers into a multilayer composite) a layer of copper oxide, such as by chemical oxidation of the copper surfaces have been developed.

The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations and/or improvements on the black oxide technique included methods wherein a black oxide coating is produced on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984. Notable improvements in this art are represented in U.S. Pat. Nos. 4,409,037 and 4,844,981 to Landau, the teachings both of which are included herein by reference in their entirety.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions, such as amine boranes. As a consequence, the multilayer assembly employing such circuitry innerlayers will not evidence pink ring formation since there is no copper oxide present for localized dissolution, and localized exposure of underlying copper, in subsequent through-hole processing. As with other techniques described herein, processes of this type are suspect in terms of the adhesion attainable between the dielectric substrate layers and the metallic copper circuitry innerlayers.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Here again, however, problems can arise in terms of the adhesion between the dielectric layers and metallic copper circuitry innerlayers.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography. Variations/improvements on this process are described for example in U.S. Pat. No. 5,869,130 to Ferrier. U.S. Pat. No. 6,020,029, also to Ferrier, offers the step of increasing adhesion by contacting the metal surface with an alkaline solution after the adhesion promoting composition is applied. Other improvements are described in U.S. Pat. Nos. 6,146,701, 6,162,503, 6,383,272, 6,419,784, 6,506,566 and 6,554,948 all to Ferrier.

As described herein, conventional black oxide coatings for bonding copper and copper alloys to resins are well known in the art.

Typical steps in a conventional black oxide process include:
(1) acid cleaner;
(2) alkaline cleaner;
(3) microetch;
(4) pre-dip;
(5) black oxide;
(6) post-dip; and
(7) hot air dry.

The microetch composition typically etches the copper substrate to a depth of approximately 40-55 microinches and comprises either sulfuric acid/peroxide or persulfate and is accomplished at a temperature of about 32° C. for about 1.5 to about 2.5 minutes. The predip composition used in this process is typically a 2-3% solution of sodium hydroxide that is applied at a temperature of between about 18-27° C. Thereafter, the black oxide coating is applied, which typically comprises a chlorite/sodium hydroxide mixture that is applied at a temperature of about 70-90° C. for a period of about 4 to about 6 minutes. The black oxide process is typically applied as a vertical (or immersion) application. Next, the black oxide coated copper is subjected to a post dip treatment, which typically comprises an amine borane, such as dimethyl amino borane, as described for example in U.S. Pat. No. 4,643,161 to Akahoski, and which is applied at a temperature of abut 35° C. for about 4-5 minutes. In the alternative, controlled dissolution of the copper can be accomplished. Finally hot air drying is performed at a temperature of about 66-93° C. for about 6-12 minutes.

In an "alternative oxide" coating process, which is typically applied in a horizontal (i.e., conveyorized) application, the steps typically include:
(1) acid cleaner;
(2) alkaline cleaner;
(3) microetch;
(4) predip;
(5) brown oxide;
(6) optional post-dip for enhanced bonding; and
(7) hot air dry.

The microetch composition typically etches the copper substrate to a depth of approximately 40-60 microinches and comprises either sulfuric acid/peroxide or persulfate and is accomplished at a temperature of about 32° C. for about 1.5 to about 2.5 minutes. The predip composition used in this process is typically a caustic or an acid/peroxide solution. Thereafter, the alternative conversion coating is applied, which typically comprises a solution of sulfuric acid, a peroxide and benzotriazole-based additives and is applied at a temperature of about 32-38° C. for a period of about 45 seconds to about 1.5 minutes. In this alternative oxide process, the post dip is optional and is used generally with high Tg materials for enhanced bonding. Finally, hot air drying is performed at a temperature of about 66 to 93° C. for 10 to 20 seconds using a turbo drying process.

The inventors of the present invention have found that it is desirable to provide further improvements to the bond between copper/copper alloy and resin in multilayer circuit board construction. It is also desirable to provide an enhanced passivate nano-oxide coating method that produces a unique bond between no-profile copper/copper alloy and resin. Finally, it is desirable to provide an enhanced coating method that provides cost savings as compared to the conventional processes and significantly reduces the waste treatment cost for the process.

The present invention describes a process for improving the adhesion of polymeric materials to a metal surface, especially copper or copper alloy surfaces. The process set forth herein is particularly useful in the production of multilayer printed circuits. The process described herein provides optimum adhesion between the metallic and polymeric surfaces (i.e., the circuitry and the intermediate insulating layer), eliminates or minimizes pink ring and operates economically, all as compared to conventional processes. Finally, the process described herein also provides an improved bond between copper and high performance resin materials.

SUMMARY OF THE INVENTION

It is an objective of the present invention to develop a unique enhanced nano oxide process for providing superior adhesion on both conventional and high performance (i.e., high Tg, halogen-free and low loss) resins.

It is another object of the present invention to provide a means for providing no-etch capability to maintain signal integrity and meet the requirements of the state-to-end technology market It is still another object of the present invention to provide a process that is more environmentally friendly and more cost effective than processes of the prior art.

To that end, in one embodiment, the present invention relates generally to a method of increasing adhesion between a copper or copper alloy layer and a polymeric resin, the method comprising the steps of:
a) applying a pre-dip composition to the copper layer;
b) apply a nano-oxide composition to the treated copper layer, wherein the nano-oxide composition comprises:
   i) a chlorite salt such as sodium chlorite;
   ii) a source of alkalinity such as a caustic;
   iii) a phosphate salt;
   iv) an organic nitro compound; and
   v) a thio compound; and
c) applying a post-dip composition to the nano-oxide treated surface, and
d) thereafter, bonding a resin to the treated copper surface.

The present invention also relates generally to a nano-oxide composition for improving adhesion between copper or copper alloy and a resin, the composition comprising:
(a) a chlorite salt such as sodium chlorite;
(b) a source of alkalinity such as a caustic;
(c) a phosphate salt;
(d) an organic nitro compound; and
(e) a thio compound.

The present invention also relates generally to a post-dip composition for enhancing bonding of a treated copper surface to a resin, the composition comprising:
a) phosphate salt;
b) a source of molybdenum ions; and
c) a thiazole.

DETAILED DESCRIPTION OF THE PREFERRED EMBODIMENTS

Figure 1:
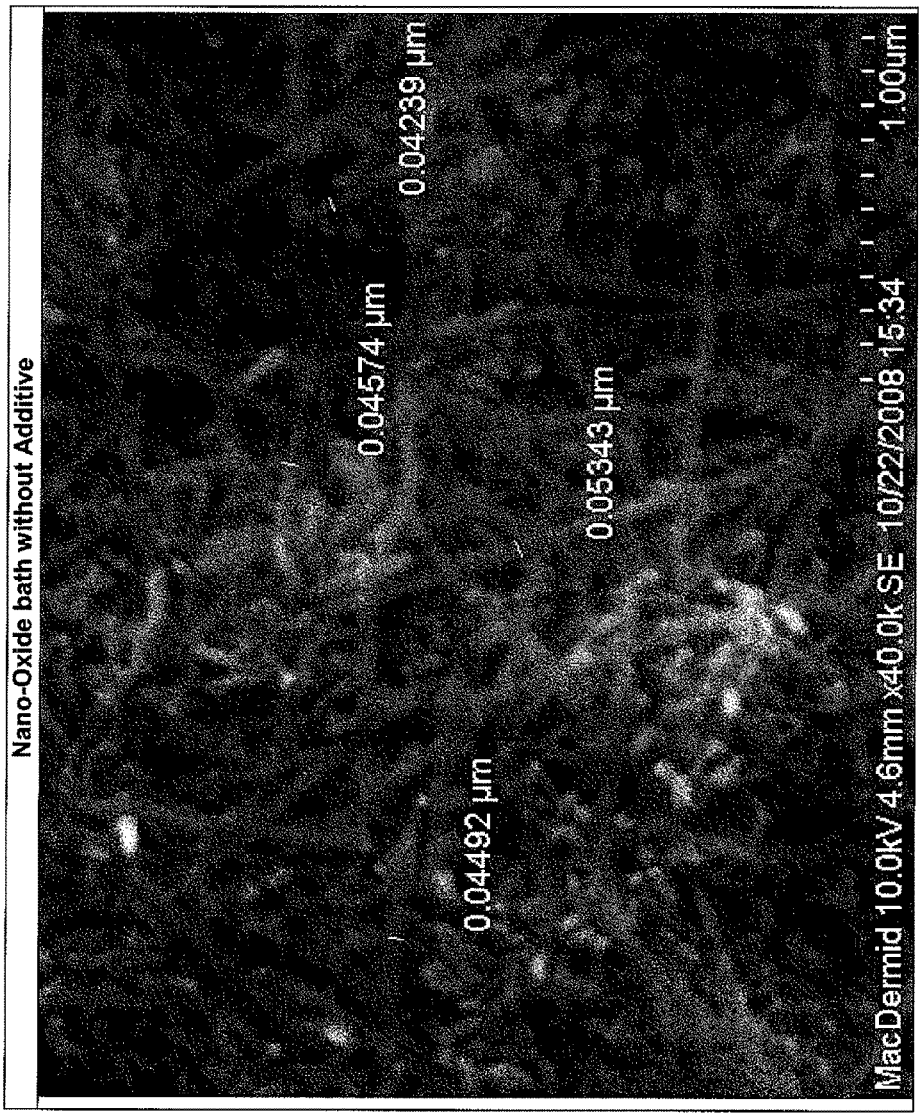
FIG. 1 depicts an SEM image of a copper surface coated with a copper oxide coated surface.

The present invention relates generally to a process for an enhanced passivate nano-oxide coating on copper or copper alloy to produce a unique bond between no-profile copper/copper alloy and a resin.

As described herein, a specially nano-oxide seeded copper/copper alloy layer surface is produced by treating the copper surface with an aqueous alkaline composition that includes an oxidizer (such as chlorite), a bidentate ligand (such as 3,5-dinitrosalicylic acid), preferably a polymeric phase transfer catalyst (such as PEG 400) and a reducing catalyst (such as sodium thiosulfate) for a period of time at an elevated temperature. Other similar compounds are also usable in the nano-oxide composition of the invention as described herein.

The present invention is also directed to an enhanced bonding method for the passivate nano-oxide coating described herein though use of an alkaline post-dip system comprising molybdate and an aminothiazole. Based thereon, strong bonding is provided while laminated with a variety of resins, including high performance materials such as high Tg, halogen-free and high speed/low loss materials.

The enhanced nano-oxide process of the invention typically comprises the following steps:
(1) acid cleaner;
(2) alkaline cleaner;
(3) pre-dip;
(4) nano-oxide;
(5) enhanced bonding post-dip; and
(6) hot air dry.

As is readily seen, unlike the conventional black oxide and alternative oxide processes described above, the enhanced nano-oxide coating of the invention does not require a micro-etching step.

The present invention also relates generally to an enhanced passivate nano-oxide coating method that creates a unique bond between no-profile copper/copper alloy and resin.

The pre-dip composition comprises a source of alkalinity, such as a caustic, and a phosphate salt. The caustic is typically a hydroxide such as sodium hydroxide or potassium hydroxide with sodium hydroxide being preferred. The sodium hydroxide is typically present in the pre-dip composition at a concentration within the range of about 10-40 g/l, preferably about 25-30 g/l.

The phosphate salts useful in this composition include alkali metal phosphate salts such as lithium, sodium and potassium phosphate, and quaternary nitrogen phosphate salts such as ammonium phosphate, and water soluble alkaline metal phosphate salts. Phosphate salts can be either mono, dibasic or tribasic (e.g., $NaH_2PO_4$, $Na_2HPO$, and $Na_3PO_4$). As known in the art, $Na_3PO_4$ is called sodium orthophosphate and is derived from the reaction of orthophosphoric acid, $H_3PO_4$, and three equivalents of sodium hydroxide. Other phosphate salts usable in the present invention include water stable polyphosphate salts such as diphosphoric acid tetrabasic, and sodium tripolyphosphate. Preferred salts include potassium and sodium phosphate dibasic. The potassium phosphate may comprise a pre-made concentrated buffer solution, which comprises diluted 85% phosphoric acid that is pH adjusted by an appropriate amount of 45% potassium hydroxide. The potassium phosphate is typically present in the pre-dip composition at a concentration within the range of about 5-25 g/l, preferably about 15-20 g/l. The pre-dip composition is typically applied to the copper or copper alloy surface at a temperature of about 50° C. for about 45 seconds to about 1.5 minutes.

Thereafter, the novel nano-oxide composition is applied to the pre-dip treated copper surface. The nano-oxide composition described herein typically comprises chlorite salt, a caustic, a phosphate salt, an organic nitro compound, a thio compound, and preferably a polymeric phase transfer catalyst such as a polyethylene glycol.

The chlorite salt (usually sodium chlorite) is typically present in the nano-oxide composition at a concentration of between about 150 to about 250 g/l, preferably about 210 to about 225 g/l and preferably a pre-made concentrated aqueous solution is used.

Similarly to the pre-dip composition, the caustic is preferably a hydroxide, such as sodium hydroxide and is typically present in the composition at a concentration of between about 5 to about 30 g/l, preferably 7 to 10 g/l. However, the amount of hydroxide used in the nano-oxide composition depends in part on the type of resin to which the copper will be bonded and it may be necessary to determine the optimal amount of hydroxide, depending on the resin being used. For example, the inventors have found that dicyaniamide (DICY)-cured epoxy resins, such as FR406, available from Isola Group, Chandler Ariz. can utilize a fairly wide process window, within the range of about 8 to 28 g/l of sodium hydroxide. In contrast, halogen-free resins such as those available from Hitachi Chemical Co. Ltd., Japan, prefer a lower amount within the range of about 5 to 8 g/l of sodium hydroxide and high speed/low loss resins, such as Iso408 and Iso408HR, available from Isola group, prefer a window within the range of about 5 to about 10 g/l of sodium hydroxide.

The phosphate salt can be any of the phosphate salts described above for use in the pre-dip composition of the invention. In one embodiment, the phosphate salt is potassium phosphate and is prepared in the same manner as described above for the pre-dip composition and is also used at a similar concentration.

The organic nitro compounds useable in the nano-oxide composition of the present invention are preferably aromatic nitro compounds. Some examples of particularly useful organic nitro compounds include sodium meta-nitrobenzenesulfonate, para-nitrophenol, 3,5-dinitrosalicylic acid, and 3,5-dinitrobenzoic acid. In one embodiment, the organic nitro compound is 3,5-dinitrosalicylic acid. The organic nitro compound is typically used in nano oxide composition of the invention at a concentration of between about 0.1 to 0.2 g/l.

The composition may also include a polymeric phase transfer catalyst such as a surfactant or a water soluble polymer. The inventors have found that a polyethylene glycol, such as PEG400 is particularly useful and is typically present in the composition at a concentration of between about 0.25 and 1.5 preferably about 0.5 g/l.

The nano-oxide composition also typically includes a thio compound, which in one embodiment may be a thiosulfate salt. The thiosulfate salt may comprise sodium thiosulfate, potassium thiosulfate, and ammonium thiosulfate, and the like. Thiosulfuric acid and thiosulfate salts are preferred. Most preferred is sodium thiosulfate. When thiosulfate ion is used, it can be supplied in any solution soluble form, such as an alkali thiosulfate (e.g., sodium or potassium) or ammonium thiosulfate, with sodium thiosulfate pentahydrate being the most economical and readily available source. The sodium thiosulfate is preferably added to the nano-oxide composition of the invention right before the solution is made up, by pre-mixing the required amount of crystals with an appropriate amount of deionized water. It is then desirable that the pre-mix be incorporated into the solution. The concentration of the thio compound in the solution is preferably within the range of about 0.2 to about 0.8 g/l, preferably within the range of about 0.2 g/l.

The present invention also relates generally to a post dip composition that is applied after the novel nano-oxide composition is applied. This post dip composition typically comprises a phosphate salt, a source of molybdenum ions and a thiazole. The useable phosphate salts are the same as described for use in the pre-dip. The concentration of the phosphate salt in the post-dip should be from 45 to 60 of g/l. The pH of the post-dip solution should be adjusted to within the desired range of about 9 to 11.

Suitable sources of molybdenum ions include any molybdenum-containing ion soluble in the aqueous solution of the post-dip. Preferred sources of molybdenum ions are molybdate salts, such as sodium molybdate, and phosphomolybdic acid. Other suitable sources of molybdenum ions include molybdic acid, molybdic anhydride, and salts of phosphomolybdic acid. Sodium molybdate is preferred and is typically used in the post-dip at a concentration of about 20 to 40 g/l.

In one embodiment, the thiazole is an aminothiazole or a substituted aminothiazole. Suitable substituted thiazoles include, but are not limited to 2-amino thiazole and 2-mercaptobenzothiazole. Of these, 2-aminothiazole is preferred. The thiazole is typically present in the post dip composition at a concentration of about 5 to 30 g/l, preferably about 20 g/l.

In the steps of the process, as described above, the steps are typically as follows:
1) Apply an acid cleaner at a temperature of about 45 to 55° C. for about 45 seconds to about 1.5 minutes;
2) Apply an alkaline cleaner at a temperature about 50 to 60° C. for about 1 to 2 minutes;
3) Apply the pre-dip solution at a temperature of about 50 to 55° C. for about 45 seconds to about 1.5 minutes;
4) Apply the nano-oxide composition at a temperature of between about 65 to 75° C. for about 45 seconds to about 1.5 minutes;
5) Apply the post-dip composition at a temperature of between about 45 to 55° C. for about 1.5 to about 2.5 minutes; and
6) Perform hot air drying at a temperature of about 65 to 95° C. for 10 to 20 seconds using a turbo drying process.

The process of the present invention produces a prepared copper surface that can then be laminated to various high performance materials. Examples of suitable high performance materials include, high Tg, halogen-free and high speed/low loss materials. These materials are available, for example, from Hitachi Chemical Co., Ltd., Japan under the tradename MCL-BE-67G(H) and from Isola Group, Chandler, Ariz., under the tradename Iso408 and Iso408HR, by way of example and not limitation.

As described herein, a SEM/EDX study has revealed that copper oxide nanowires created with the process of this invention have an average diameter in the range of about 20 to about 80 nm. An SPC study on conventional weight gain versus nano-oxide specific gravity has demonstrated that nano-oxide coatings in accordance with the present invention have an average thickness in the range of about 50 nm to about 100 nm. Furthermore, the enhanced passivate nano-oxide coatings described herein are useful in any application directed to copper/copper alloy bonding to a dielectric material, especially in printed circuit board fabrication and packaging and in applications dedicated to the high speed/low loss electronics market.

Example 1

An oxide bath (without organics) was prepared comprising:

| | |
|---|---|
| 225 g/l | sodium chlorite |
| 8.4 g/l | sodium hydroxide |
| 6.5 g/l | potassium phosphate |

The foregoing bath was applied to a copper surface and an SEM image of the copper surface, is shown in FIG. 1.

Figure 2:
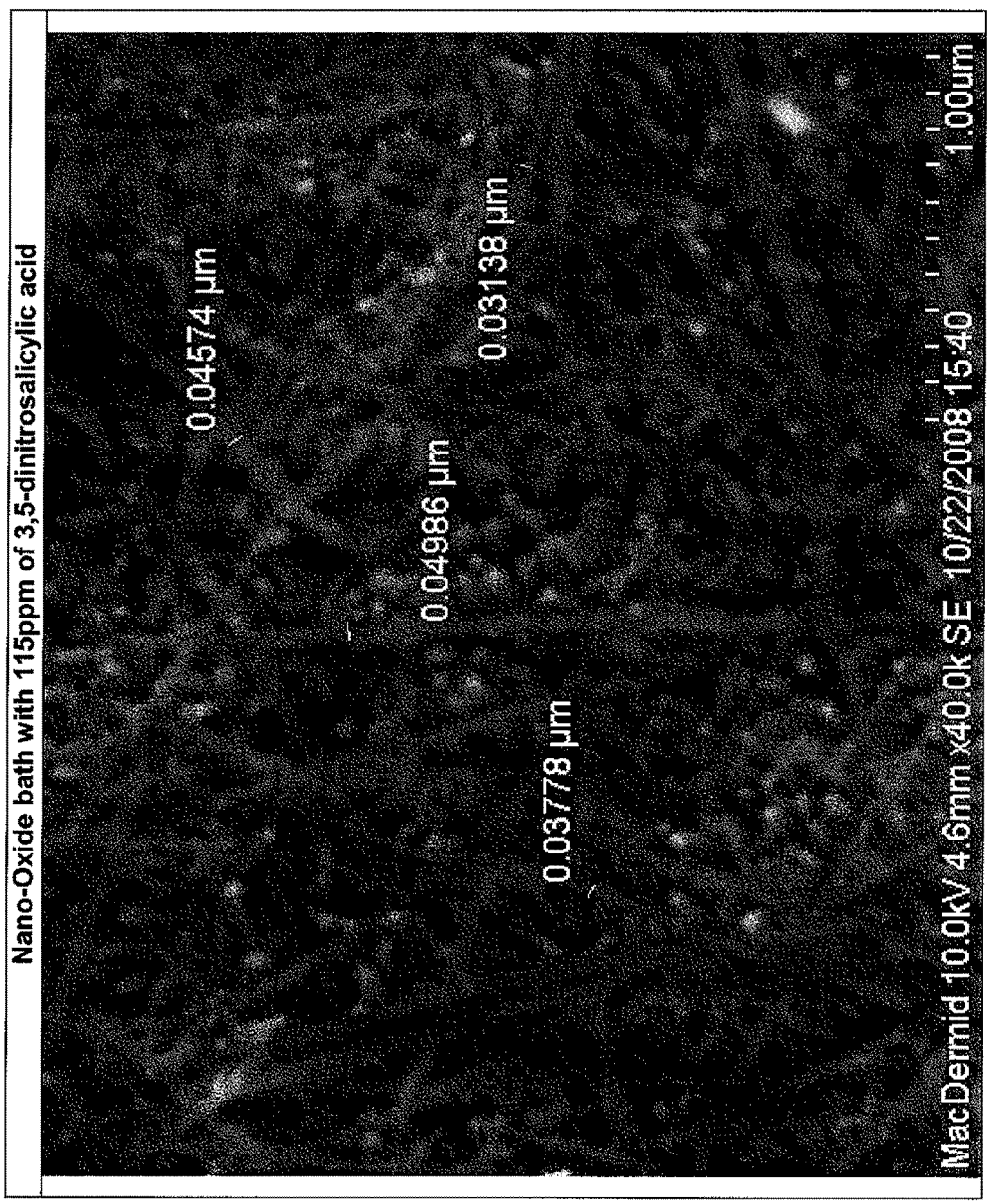
FIG. 2 depicts an SEM image of a copper surface coated with a bath containing 115 ppm of 3,5-dinitrosalicylic acid in accordance with the present invention.

Thereafter, a nano-oxide bath as described above was prepared with the addition of 115 ppm of 3,5-dinitrosalicylic acid and the results are shown in FIG. 2.

Figure 3:
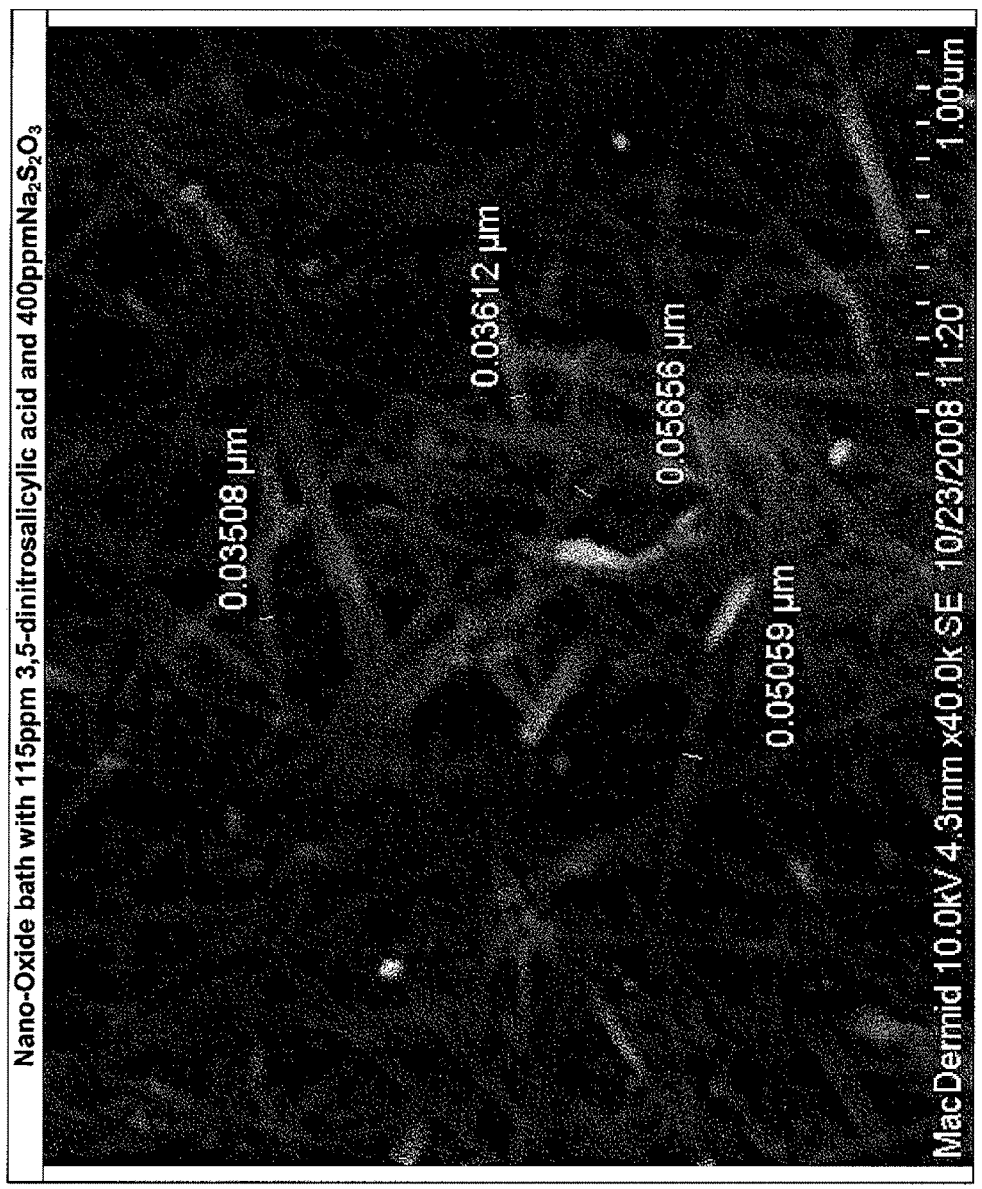
FIG. 3 depicts a standard SEM image of a copper surface coated with a bath containing 115 ppm of 3,5 dinitrosalicylic acid and 400 ppm of sodium thiosulfate in accordance with the present invention.

Finally, a nano-oxide bath as described above was prepared with the addition of 115 ppm of 3,5-dinitrosalicylic acid and 400 ppm of sodium thiosulfate and the results are shown in FIG. 3.

Example 2

A nano-oxide bath was prepared comprising:

| | |
|---|---|
| 225 g/l | sodium chlorite |
| 8.4 g/l | sodium hydroxide |
| 6.5 g/l | potassium phosphate |
| 115 ppm | 3,5-dinitrosalicylic acid |
| 400 ppm | sodium thiosulfate |

This bath was used to evaluate the effect of temperature of the nano-wire diameter on the copper surface.

This bath was applied to copper surfaces at temperatures of 35° C., 45° C., 50° C.°, 56° C., 60° C. and 70° C. The application of the composition at higher temperatures produced nano-wires having significantly smaller diameters than at lower temperatures.

Example 3

A peel strength test coupon set by a 3 inch by 4.5 inch size of double sided copper clad and the same size of copper foil were immersion processed through the following cycle:
1) MacDermid Acid Cleaner at 50° C. for 1 minute, followed by rinsing for 1 minute.
2) MacDermid Alkaline Cleaner R at 50° C. for 1.5 minutes, followed by rinsing for 1.5 minutes.
3) PreDip bath, at 50° for 1 minute.
4) An oxide bath at 70° C. for 1 minute, followed by rinsing for 1 minute.
5) Compressed air blow dry The PreDip bath composition comprises:

| | |
|---|---|
| Sodium hydroxide | 28.0 g/l |
| Potassium phosphate | 6.55 g/l |

The oxide bath composition comprises:

| | |
|---|---|
| Sodium chlorite | 210 g/l |
| Sodium hydroxide | 5.6 g/l |
| Potassium phosphate | 6.55 g/l |

A shiny gold coating was formed on all copper surfaces of the coupon set.

The coupon and foil were de-moisturized at 110° C. for 20 minutes prior to layering up with ISOLA 406 Prepreg: 1 of the same size of 7628 Prepreg (both available from Isola Group, Inc., Chandler, Ariz.) was sandwiched between 2 of the same size of 1080 no-flow prepreg or halogen-free HITACHI HF prepreg in the same construction. The materials were then laminated under designed program per each material.

After lamination, the test coupons were then worked up through routing, scribing, tapping, selective stripping, detapping, post baking for 2 hours at 110° C. and then solder shocked at 288° C. for 3×10 seconds and 6×10 seconds. One inch wide copper foil per each test coupon was measured for peel strength in a Peel strength tester.

The following peel strengths were observed:

TABLE I

| | Solder shock at 288° C. | Peel strength |
|---|---|---|
| Prepreg ISOLA 406 | 0 seconds | 8.0 lb/in |
| | 3 × 10 seconds | 6.5 lb/in |
| | 6 × 10 seconds | 1.0 lb/in |
| Prepreg HITACHI-HF | 0 seconds | 2.2 lb/in |
| | 3 × 10 seconds | 2.0 lb/in |
| | 6 × 10 seconds | 1.7 lb/in |

Example 4

The same process and bath parameters were used as in Example 3, except the nano-oxide bath in this example 4 also included the following additive system:

| | |
|---|---|
| 3,5-dintro salicylic acid | 0.130 g/l |
| Poly(ethylene glycol) | 0.5 g/l |
| Sodium thiosulfate | 0.2 g/l |

The same test vehicle was processed as in Example 3. The following peel strengths were observed:

TABLE II

| | Solder shock at 288° C. | Peel strength |
|---|---|---|
| Prepreg ISOLA 406 | 0 seconds | 7.9 lb/in |
| | 3 × 10 seconds | 6.5 lb/in |
| | 6 × 10 seconds | 3.5 lb/in |
| Prepreg HITACHI-HF | 0 seconds | 3.5 lb/in |
| | 3 × 10 seconds | 3.2 lb/in |
| | 6 × 10 seconds | 3.5 lb/in |

Example 5

The exact same process and test parameter as in Example 3 was used except for the following bath concentration changes:

The pre-dip bath comprised the following:

| | |
|---|---|
| Sodium hydroxide | 28.0 g/l |
| Potassium phosphate | 18.0 g/l |

The oxide bath comprised the following:

| | |
|---|---|
| Sodium chlorite | 210 g/l |
| Sodium hydroxide | 5.6 g/l |
| Potassium phosphate | 16.5 g/l |

The Post-dip bath comprised the following:

| | |
|---|---|
| Phosphoric acid (85%) | 20 ml/L |
| Potassium hydroxide (45%) | 45+ ml/L to pH at room temperature of 10.50 |
| Sodium molybdate | 30 g/l |
| 2-aminothiazole | 20 g/l |

The test vehicle was processed as in Example 3 and the following peel strengths were observed:

TABLE III

| | Solder shock at 288° C. | Peel strength |
|---|---|---|
| Prepreg ISOLA 408 | 0 seconds | 5.0 lb/in |
| | 3 × 10 seconds | 4.4 lb/in |
| | 6 × 10 seconds | 3.8 lb/in |

Example 6

The same process and test parameter as in Example 5 were used except that a reverse treated foil (RTF) foil was tested and replaced the above standard uncoated copper foils.

The same test vehicle was processed as in Example 5 and the following peel strengths were observed:

TABLE IV

| | Solder shock at 288° C. | Peel strength |
|---|---|---|
| Prepreg ISOLA 406 | 0 seconds | 6.2 lb/in |
| | 3 × 10 seconds | 5.5 lb/in |
| | 6 × 10 seconds | 5.0 lb/in |
| Prepreg HITACHI-HF | 0 seconds | 5.5 lb/in |
| | 3 × 10 seconds | 5.0 lb/in |
| | 6 × 10 seconds | 4.5 lb/in |

Thus, it can be seen that the present invention provides excellent peel strength under various conditions and using various materials.

Table V provides a comparison of the enhanced nano-oxide process described herein with the conventional black oxide and alternative oxide processes of the prior art.

TABLE V

Comparison of Nano-Oxide Process to the Prior Art Oxide Processes

| Perspective | Conventional Black Oxide | Alternative Oxide | Enhanced Nano Oxide |
|---|---|---|---|
| Microetch | Yes | Yes | No |
| Number of Processing steps | 6 | 5 (6 with enhance) | 5 |
| Application | Vertical | Horizontal & Vertical | Horizontal & Vertical |
| Total Cycle Time | 50 ± 5 minutes | 8 ± 1 minute (Optional step may require additional 2-3 minutes) | 9 ± 1 minute |
| Total cost | High | Cost effective | Cost saving |
| Waste treatment cost | High | High | Low |

Finally, in the enhanced nano oxide process of the present invention, the application can be either horizontal or vertical, which provides a real customized application, including the use of high performance materials. The enhanced nano-oxide process described herein also exhibits significant cost savings, especially as compared to both the conventional black oxide and the alternative oxide processes. The enhanced nano-oxide process uses only about 1/10 of the chemical consumption of the conventional black oxide process and has very low additive consumption, due to self-determined passivating coating. The waste treatment cost of the enhanced nano oxide process of the invention is also low as compared to both the conventional black oxide and the alternative oxide processes because there is no etched copper and much less oxide precipitates and organic waste due to the passivate mechanism.

It is also to be understood that the following claims are intended to cover all of the generic and specific features of the invention described herein and all statements of the scope of the invention which as a matter of language might fall therebetween.

What is claimed is:

1. A method of increasing adhesion between a copper or copper alloy layer and a polymeric resin, the method comprising the steps of:
   a) applying a pre-dip composition to the copper layer;
   b) applying a nano-oxide composition to the treated copper layer, wherein the nano-oxide composition comprises:
      i) a chlorite salt;
      ii) a source of alkalinity;
      iii) a phosphate salt;
      iv) an organic nitro compound; and
      v) a thio compound and
   c) applying a post-dip composition to the nano-oxide treated surface, and
   d) thereafter, bonding a resin to the treated copper surface.

2. The method according to claim 1, wherein a microetching step is not performed.

3. The method according to claim 1, wherein the post-dip composition comprises:
   a) a phosphate salt;
   b) a source of molybdenum ions; and
   c) a thiazole.

4. The method according to claim 3, wherein the post-dip composition has a pH of between about 9 and about 11.

5. The method according to claim 1, wherein the pre-dip composition comprises a phosphate salt and a source of alkalinity.

6. The method according to claim 1, wherein the nano-oxide coating is applied at a temperature of between about 65 to about 75° C.

7. The method according to claim 3, wherein the post-dip composition is applied at a temperature of between about 45 to about 55° C.

8. The method according to claim 1, wherein the concentration of the chlorite salt is between about 150 to about 250 g/l.

9. The method according to claim 1, wherein the source of alkalinity is selected from the group consisting of potassium hydroxide and sodium hydroxide.

10. The method according to claim 9, wherein the source of alkalinity is sodium hydroxide.

11. The method according to claim 9, wherein the concentration of the source of alkalinity is between about 5 to about 30 g/l.

12. The method according to claim 1, wherein the phosphate salt is selected from the group consisting of lithium phosphate, sodium phosphate and potassium phosphate.

13. The method according to claim 12, wherein the phosphate salt is potassium phosphate.

14. The method according to claim 12, wherein the concentration of the phosphate salt is between about 5 to about 25 g/l.

15. The method according to claim 1, wherein the organic nitro compound is selected from the group consisting of sodium meta-nitrobenzenesulfonate, paranitrophenol, 3,5-dinitrosalicylic acid, and 3,5-dinitrobenzoic acid.

16. The method according to claim 15, wherein the organic nitro compound is 3,5-dinitrosalicylic acid.

17. The method according to claim 15, wherein the concentration of the organic nitro compound is between about 0.1 to about 0.2 g/L.

18. The method according to claim 1, wherein the thio compound is a thiosulfate salt selected from the group consisting of sodium thiosulfate, potassium thiosulfate, ammonium thiosulfate, and combinations of one or more of the foregoing.

19. The method according to claim 18, wherein the thio compound is sodium thio sulfate.

20. The method according to claim 18, wherein the concentration of the thio compound is between about 0.2 to about 0.8 g/l.

21. The method according to claim 1, further comprising a surfactant or a water soluble polymer.

22. The method according to claim 21, wherein the concentration of the surfactant or water soluble polymer is between about 0.25 to about 1.5 g/l.

23. The method according to claim 3, wherein the source of molybdenum ions is selected from the group consisting of sodium molybdate, phosphomolybdic acid, molybdic acid, molybdic anhydride, and salts of phosphomolybdic acid.

24. The method according to claim 23, wherein the source of molybdenum ions is sodium molybdate.

25. The method according to claim 23 wherein the concentration of the source of molybdenum ions is between about 20 to about 40 g/l.

26. The method according to claim 3, wherein the thiazole is selected from the group consisting of aminothiazoles and substituted aminothiazoles.

27. The method according to claim 26, wherein the thiazole is 2-aminothiazole.

28. The method according to claim 26, wherein the concentration of the thiazole is between about 5 to about 30 g/l.

* * * * *